United States Patent
Lewis et al.

(10) Patent No.: US 7,643,575 B2
(45) Date of Patent: Jan. 5, 2010

(54) AC COUPLING BANDWIDTH SWITCH

(75) Inventors: Michael Lewis, Maersta (SE); Mikael Rudberg, Vikingstad (SE); Elmar Wagner, Duisburg (DE)

(73) Assignee: Infineon Technologies AG, Munich (DE)

( * ) Notice: Subject to any disclaimer, the term of this patent is extended or adjusted under 35 U.S.C. 154(b) by 201 days.

(21) Appl. No.: 11/520,180

(22) Filed: Sep. 13, 2006

(65) Prior Publication Data

US 2007/0071144 A1   Mar. 29, 2007

Related U.S. Application Data

(63) Continuation of application No. PCT/EP2005/002622, filed on Mar. 11, 2005.

(30) Foreign Application Priority Data

Mar. 18, 2004   (EP)   .................... 04006574

(51) Int. Cl.
  H03K 9/00   (2006.01)
  H04L 27/06  (2006.01)
  H04L 27/08  (2006.01)
  H04B 1/06   (2006.01)
  H04B 7/00   (2006.01)

(52) U.S. Cl. .................. 375/316; 375/317; 375/319; 375/324; 375/342; 375/344; 375/345; 375/346; 375/354; 375/360; 375/377

(58) Field of Classification Search .......... 375/136, 375/240, 316, 344–345, 354, 360, 362, 365, 375/317, 319, 340, 377; 455/127.2, 232.1, 455/234.1, 244.1, 245.1

See application file for complete search history.

(56) References Cited

U.S. PATENT DOCUMENTS

| | | | |
|---|---|---|---|
| 4,625,320 A | | 11/1986 | Butcher |
| 4,821,292 A | * | 4/1989 | Childress .................... 375/319 |
| 5,212,826 A | * | 5/1993 | Rabe et al. .................. 455/214 |
| 5,603,112 A | * | 2/1997 | Gabato et al. ............ 455/226.2 |
| 5,646,569 A | * | 7/1997 | Bruhns et al. ............... 327/307 |
| 6,032,282 A | * | 2/2000 | Masuda et al. .............. 714/744 |
| 6,442,380 B1 | * | 8/2002 | Mohindra ................ 455/234.1 |
| 6,654,593 B1 | * | 11/2003 | Simmons et al. ......... 455/234.1 |
| 6,784,727 B1 | * | 8/2004 | Cao et al. .................... 327/553 |
| 6,909,760 B2 | * | 6/2005 | Borowski et al. ........... 375/367 |
| 7,003,271 B2 | * | 2/2006 | Kluge et al. ............. 455/240.1 |
| 7,062,243 B2 | * | 6/2006 | Simmons et al. ......... 455/234.1 |
| 7,088,765 B1 | * | 8/2006 | Green et al. ................. 375/142 |
| 7,158,542 B1 | * | 1/2007 | Zeng et al. .................. 370/513 |
| 7,171,185 B2 | * | 1/2007 | Matsumoto et al. ......... 455/324 |
| 7,236,544 B2 | * | 6/2007 | Williams et al. ............ 375/316 |
| 2003/0086516 A1 | | 5/2003 | Wagner |
| 2004/0125869 A1 | * | 7/2004 | May et al. .................... 375/219 |

* cited by examiner

*Primary Examiner*—Mohammad H Ghayour
*Assistant Examiner*—Sophia Vlahos
(74) *Attorney, Agent, or Firm*—Eschweiler & Associates, LLC

(57) ABSTRACT

The present invention relates to receiver equipment with AC-coupled receiver circuits and AC coupling filters. A switch connected between a first stage and a second stage among the receiver circuits is adapted to switch from a high coupling corner frequency, for rapid settling of a signal during preparation of data reception, to a low corner frequency, for low signal distortion during data reception. The receiver circuits are adapted to use known properties in the signal to perform the switch at a time when the short term DC-components of the signal are as low as possible.

14 Claims, 5 Drawing Sheets

AC COUPLING BANDWIDTH SWITCH

REFERENCE TO RELATED APPLICATIONS

This application is a continuation of PCT/EP2005/002622, filed on Mar. 11, 2005, which was not published in English, which claims the benefit of the priority date of German Patent Application No. EP 04 006 574.0, filed on Mar. 18, 2004.

FIELD OF INVENTION

The present invention relates to receiver equipment with AC-coupled receiver circuits, where it is desired to switch from a high coupling corner frequency for rapid settling during amplifier gain programming, for example, to a low corner frequency for low signal distortion during data reception. The present invention also relates to a method to switch from a high coupling corner frequency to a low corner frequency in receiver equipment with AC-coupled receiver circuits.

BACKGROUND OF THE INVENTION

It is desirable to use AC coupling between circuit stages e.g. amplifiers and mixers, in a receiver circuit in order to prevent unwanted DC signals caused by circuit DC bias voltages and mismatches from being propagated down the receiver chain.

It is also known to switch from a high coupling corner frequency, for rapid settling of a signal during preparation of data reception, to a low corner frequency, for low signal distortion during data reception, in receiver equipment with AC-coupled receiver circuits and AC coupling filters.

In receiver equipment with AC-coupled receiver circuits, where it is desired to switch from a high coupling corner frequency for rapid settling during e.g. amplifier gain programming to a low corner frequency for low signal distortion during data reception it is known that the properties of the signal are problematic when designing an AC coupling circuit for a signal with low frequency components during the preparation of data reception.

In practice this mean that the switched circuit suffers from a similar trade-off to the unswitched: in order to have reasonable settling times, it is necessary to have a reasonably high corner frequency when preparing for reception. However, the low frequency components of the signal mean that it is necessary to switch to a very much lower corner frequency for signal reception. The high initial corner frequency means that the coupling is sensitive to short term DC components, and the low final corner frequency leads to a very long settling time for the transient thus generated by the AC coupling switch.

SUMMARY OF THE PRESENT INVENTION

The following presents a simplified summary of the invention in order to provide a basic understanding of some aspects of the invention. This summary is not an extensive overview of the invention, and is neither intended to identify key or critical elements of the invention nor to delineate the scope of the invention. Rather, the purpose of the summary is to present some concepts of the invention in a simplified form as a prelude to the more detailed description that is presented later.

With the purpose of solving one or more of the above-identified problems the present invention uses known properties in the signal to perform the switching at a time when the short term DC-components of the signal are as low as possible.

In one embodiment of the invention, the switch is synchronized the switch with the received signal by means of a synchronization mechanism, by compensating for the relative delay between the signal at the AC coupling filters and the output of the synchronization mechanism, and by delaying the switch to coincide with a point where the properties of the signal cause a low switching transient amplitude.

In an exemplary case of a receiver adapted to function according to IEEE 802.11b, where the receiver comprises a preamble detection mechanism, where a preamble of a received signal comprises a BPSK-modulated Barker sequence, and where the detection mechanism produces an unsigned scalar signal which exhibits high amplitude peaks synchronised with each 1 µs symbol in the Barker sequence, the present invention comprises a detection mechanism that performs the synchronization, and that, if a peak value exceeds a certain threshold, the synchronization is achieved by locating the position of the peak over a 1 µs window, thus providing a timing reference that has a fixed timing relation to the peak position.

For the exemplary case of an 802.11b signal, the properties of the Barker code mean that, averaged over a symbol period, the DC level is 11 times less than the peak signal level. Switching at symbol boundaries therefore gives low transient amplitude regardless of which point in the 1 MHz BPSK sequence the switch occurs.

The present invention involves very little additional circuitry in the receiver, and achieves a substantial decrease in the maximum magnitude of the switching transients.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

A method and receiver equipment according to the present invention, as well as some background art, will now be described in detail with reference to the accompanying drawings, in which.

DETAILED DESCRIPTION OF THE INVENTION

Figure 1:
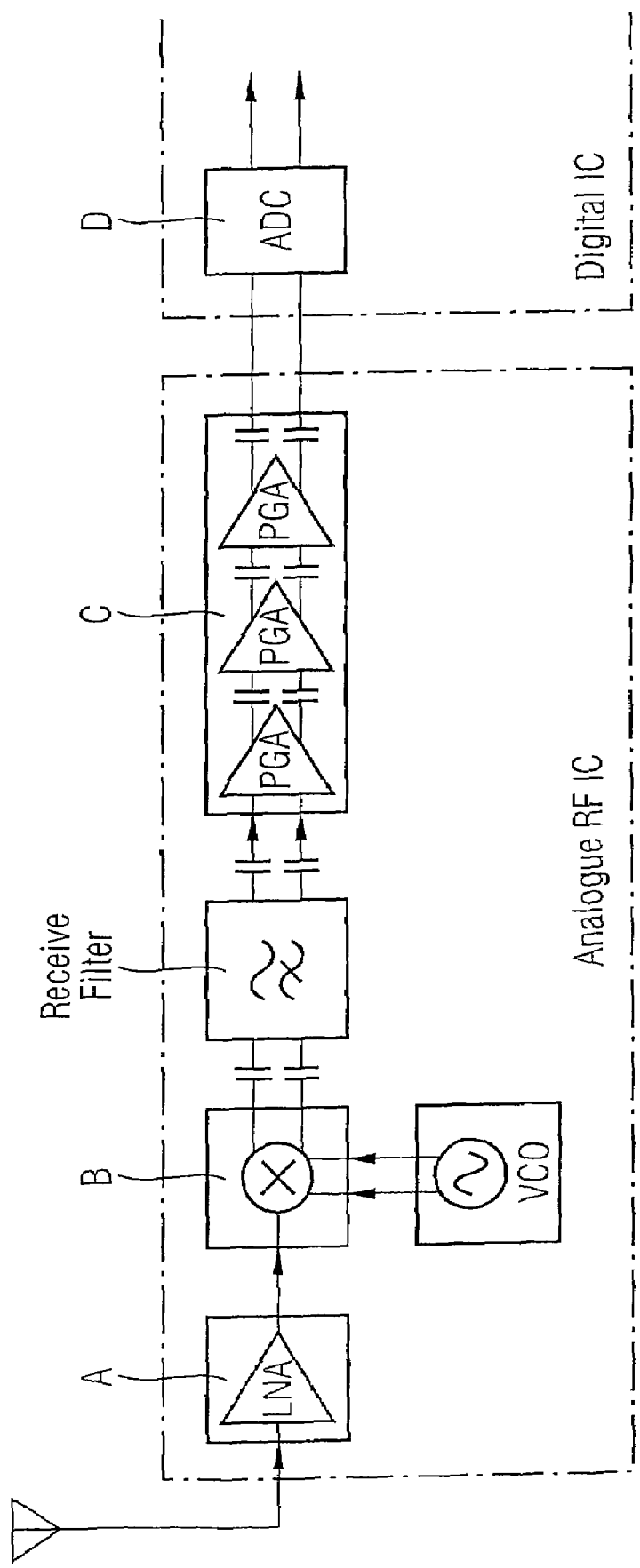
FIG. 1 is a simplified and schematic view of a known receiver circuit with AC coupling.

FIG. 1 is a prior art system that shows an example where each stage A, B, C will have some DC output, and switching of the programmable gain stages C (PGA) and the low noise amplifier A (LNA) would typically both change the DC output of the stage and would also change the amount of amplification of the DC output from the previous stages. This variable DC level, if not removed, requires increased headroom at the analogue to digital converter D, and can be difficult to remove in the digital circuitry. To avoid this, capacitors are inserted into the data path as shown in the figure. Together with the input resistance of the following stage, this forms a high-pass filter that completely removes DC components.

Typically, signals for wireless transmission are designed to have no DC component and thereby can be passed through an AC coupling chain. However, the signal may have significant low frequency components and it is therefore necessary to design an AC coupling with a corner frequency that is sufficiently low to prevent distortion of the received signal. Changes in DC level at some point in the circuit caused by e.g. switching of the programmable gain stages C cause an exponentially decaying pulse to be passed through the AC coupling. The time for this pulse to decay is inversely proportional to the corner frequency of the AC coupling, and the energy of this pulse can interfere greatly with e.g. signal strength measurements or other estimations. The requirement to avoid distortion of low-frequency signal components is therefore directly in conflict with the requirement for fast settling time of the signal after e.g. gain switching.

One way to eliminate this trade-off is to use an AC coupling circuit with a switchable corner frequency. During the initial stages of receiving a signal, the AC coupling is set with a high corner frequency, which allows the gain of the receiver to be rapidly adapted to the signal strength since switching transients die away quickly. Once the gain has been set properly, the AC coupling corner frequency is switched to a lower value to allow reception of the rest of the transmitted signal with a minimum of distortion.

Figure 2:
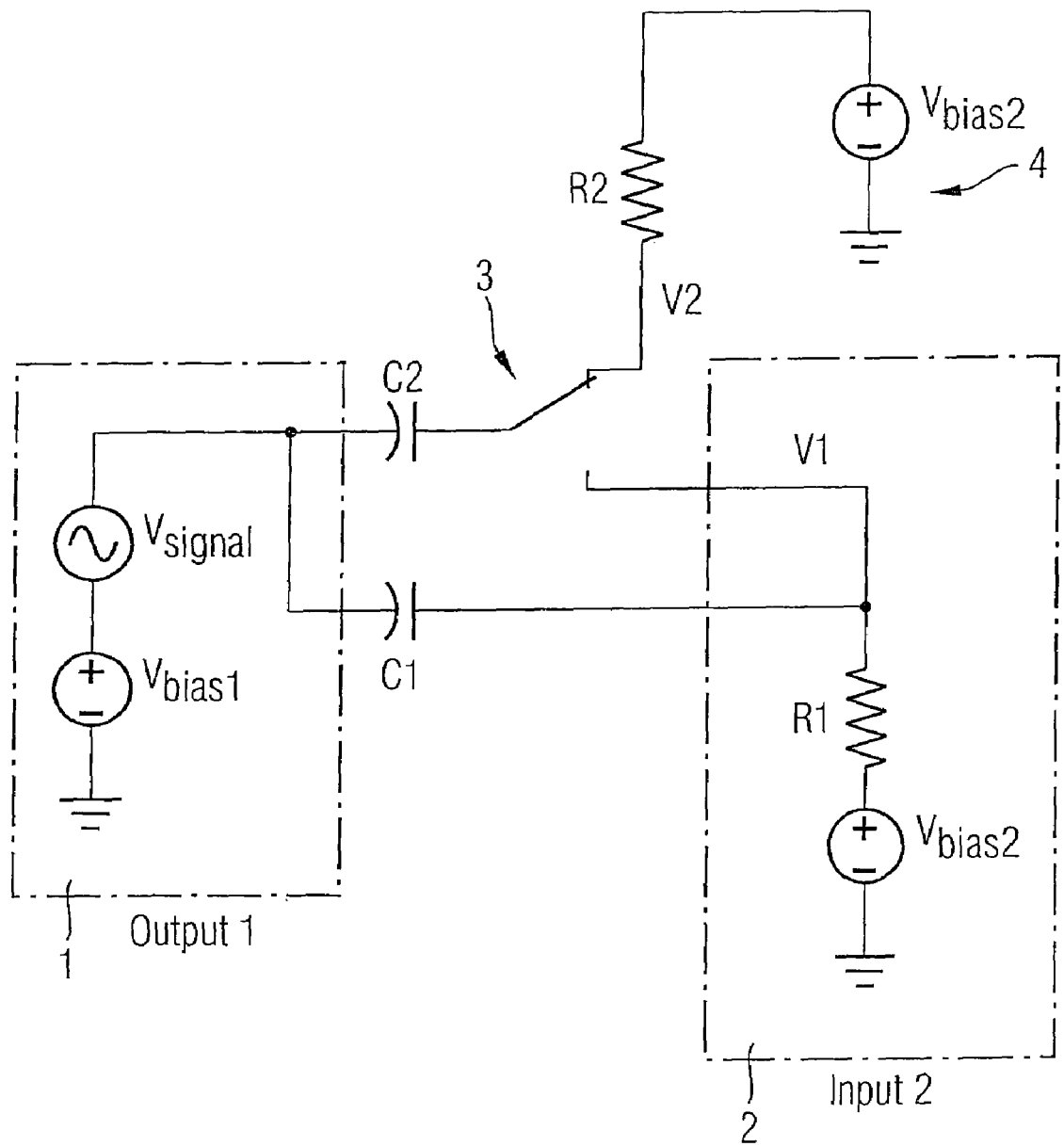
FIG. 2 is a simplified and schematic view of a known AC-coupling circuit with switchable AC bandwidth.

A conventional example of a circuit to achieve such switchable AC-coupling is shown in FIG. 2. The output of a first stage 1 being coupled consists of a DC component Vbias1 plus a signal component Vsignal; the input of a second stage 2 has a DC voltage Vbias2. The circuit is initially configured with the switch 3 as shown, to give a high corner frequency for the coupling from the first stage 1 to the second stage 2 with time constant RC1. The second capacitor C2 is connected to a precharging circuit 4 that applies the same voltage to its terminal as the bias voltage at the input of the second stage 2, Vbias2. To switch to the lower corner frequency, capacitor C2 is connected between the input of the first stage 1 and the second stage 2, giving a time constant R(C1+C2). In the absence of any DC component in the signal, the DC voltage across C2 is therefore the same regardless of the position of the switch 3 and no switching transient is generated.

Unfortunately, while many signals are designed to have no DC component in the long term, they may have significant DC components when averaged over shorter periods of time, i.e., the signal has strong low frequency components. These low frequency components cause DC voltages to appear across the capacitor during short periods of time, which will cause a switching transient if the position of switch 3 is changed during one of these time periods.

Figure 3:
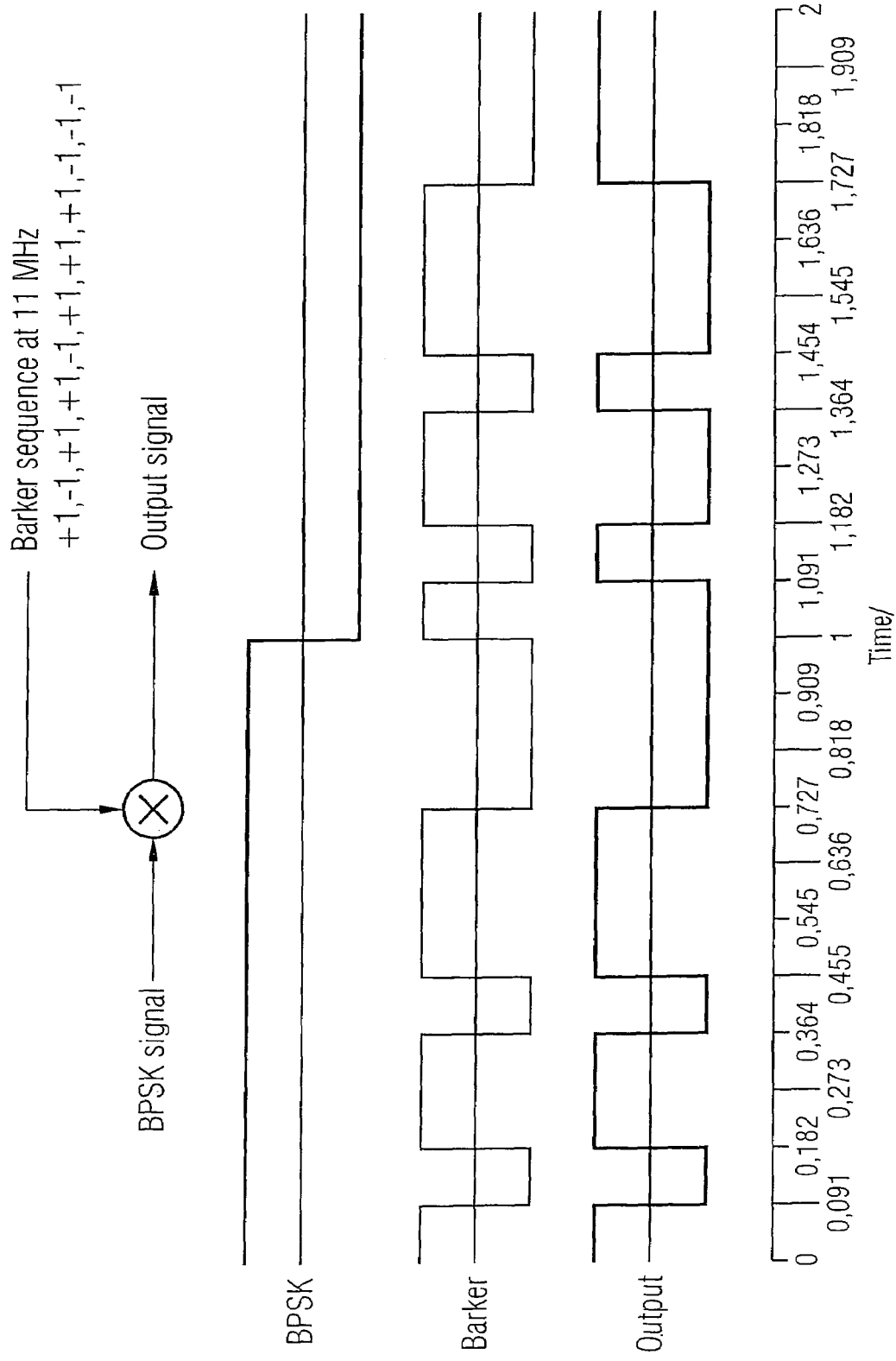
FIG. 3 is a schematic view of a Barker-sequence spread BPSK as used in IEEE 802.11b WLAN transmissions.

An example of such a signal is the preamble signal defined in the IEEE 802.11b wireless LAN standard. This consists of a pseudo-random BPSK signal with a symbol period of 1 μs. This signal is further modulated by an 11 MHz Barker sequence {+1, −1, +1, +1, −1, +1, +1, +1, −1, −1, −1}, as depicted in FIG. 3. In the long term, the underlying BPSK signal is random and therefore has zero mean. However, over shorter time periods the combination of the BPSK signal and the superimposed Barker sequence can have a large DC component.

These properties of the signal are problematic when designing an AC coupling circuit for IEEE 802.11b systems, and in practice mean that the switched circuit suffers from a similar trade-off to the unswitched: in order to have reasonable settling times, it is necessary to have a reasonably high corner frequency when performing AGC. However, the low frequency components of the signal mean that it is necessary to switch to a much lower corner frequency for signal reception. The high initial corner frequency means that the coupling is sensitive to short term DC components, and the low final corner frequency leads to a very long settling time for the transient thus generated by the AC coupling switch.

If the properties of the signal being received are known, it may be known that there are points where the short-term DC level is low. It is therefore advantageous to switch at these points, since the magnitude of any generated transient will also be low. For the exemplary case of a BPSK-modulated Barker signal used in IEEE 802.11b WLANs, the properties of the Barker sequence are such that the DC level averaged over a whole 1 μs symbol is always 11 times lower than the peak signal level, regardless of the BPSK modulation. In practice, the "averaging" time of the AC coupling is not exactly 1 μs, but it is still possible to dramatically reduce the magnitude of switching transients by aligning the bandwidth switch with symbol boundaries.

Figure 4:
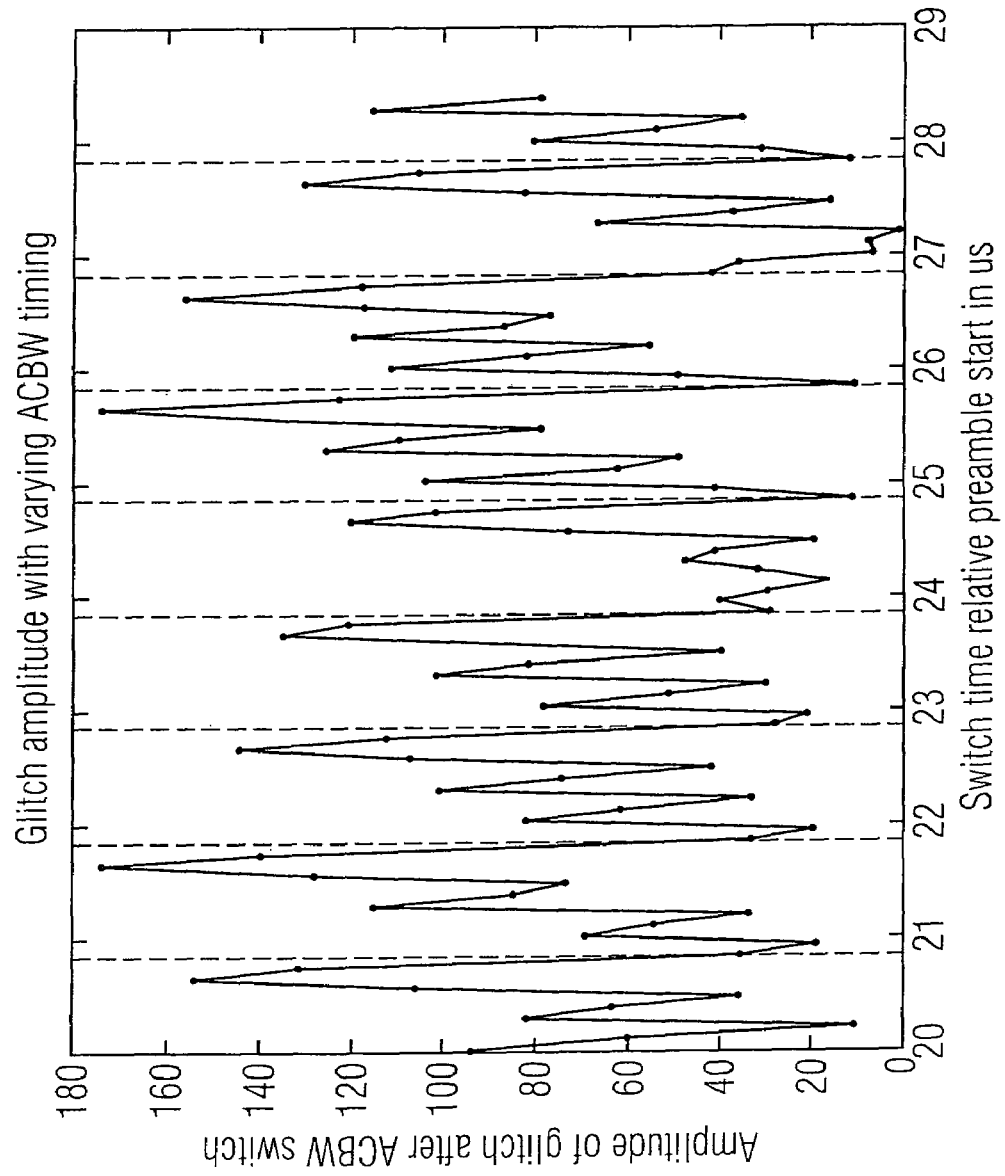
FIG. 4 is a graph showing the transient magnitude with different ACBW switching points.

An example of the difference that this can make is shown in FIG. 4, which plots the magnitude of the switching transient against switching instant for a typical system. It can be seen that there are recurring points every microsecond, marked with dashed vertical lines, where the switching transient magnitude is very much lower than the peak magnitude. Noise in the signal, and the fact that the AC coupling does not effectively average over exactly 1 μs, means that the achievable reduction is variable but switching at these times gives nonetheless a significant reduction in worst case transient amplitude.

An inventive method according to one embodiment of the invention provides that known properties in the signal are used to perform the switch at a time when the short term DC-components of the signal are as low as possible.

It is proposed in one embodiment that, in order to be able to switch at these optimum times, the following steps are employed: a synchronization mechanism synchronizes the switch with the received signal, the relative delay between the signal at the AC coupling filters and the output of the synchronization mechanism is compensated for, and the switch is delayed to coincide with a point where the properties of the signal cause a low switching transient amplitude.

Figure 5:
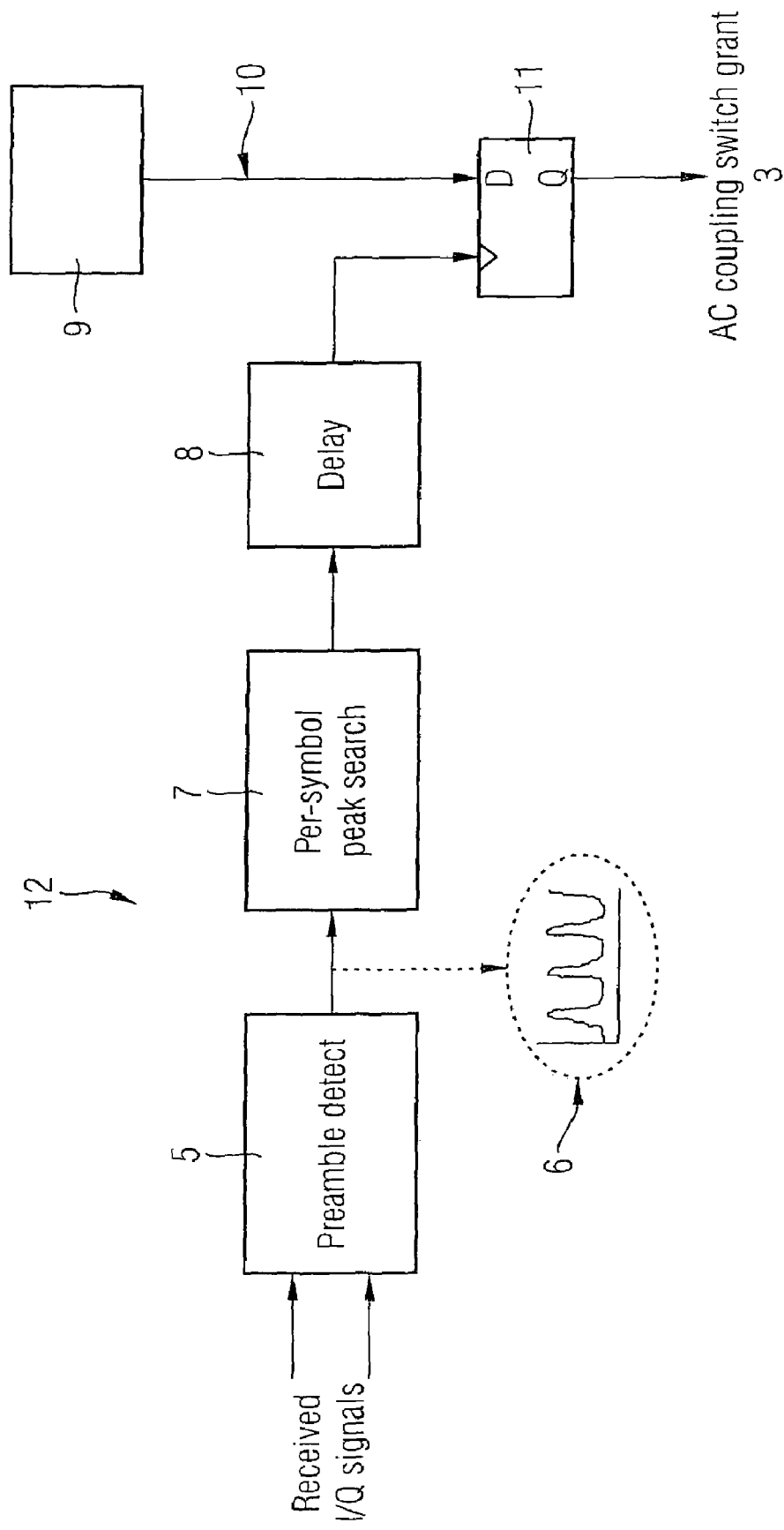
FIG. 5 is a simplified and schematic view of a circuit for AC coupling switch synchronization according to one embodiment of the invention.

FIG. 5 shows an example of an architecture for performing this process in one embodiment, for the example application of an 802.11b WLAN system. The first stage, synchronization with the received signal, can typically be achieved by the preamble detection mechanism 5 that is a necessary part of the receiver.

The preamble of a received signal comprises a BPSK-modulated Barker sequence, and the detection mechanism 5 produces an unsigned scalar signal 6 which exhibits high amplitude peaks synchronised with each 1 μs symbol in the Barker sequence.

In one embodiment of the invention, the detection mechanism 5 performs the synchronization, and if a peak value exceeds a certain threshold, the synchronization step is achieved by locating the position of the peak over a 1 μs window, thus providing a timing reference that has a fixed timing relation to the peak position.

According to one embodiment of the present invention, the peak search mechanism 7 generates an output pulse indicating the end of a 1 μs symbol in the signal. The peak search mechanism 7 may function in various ways in order to generate the output pulse and any such functionality is contemplated by the present invention.

In one exemplary embodiment the peak search mechanism 7 operates over repeating 1 µs windows, locates the peak position in the previous window, and generates the output pulse in the next window at the time corresponding to the last peak position.

Another embodiment provides for a monitoring of the current and previous outputs 6 of the preamble detection mechanism 5, and having the peak search mechanism 7 generate the output pulse at a peak position when the previous output was greater than a threshold value, and also greater than the current output.

The result of the preamble detection/peak search is a timing reference that has a fixed alignment with the incoming signal but some arbitrary timing offset. In order to take into account the timing offset between this timing reference and the optimal switching instants of the AC coupling filters, as well as the delay in performing the switch, in one embodiment the present invention teaches that a delay mechanism 8 generates a timing reference that is offset by a constant value of up to 1 µs in relation to the output pulse from the peak search mechanism 7.

The decision to make the switch is made by a control unit 9. The control unit 9 requests a switch by generating an AC coupling switch request signal 10. In one embodiment of the invention the switch request signal 10 is gated 11 by the offset timing reference generated by the delay mechanism 8 such that a request to make a switch is only granted at one of the optimal switching instants.

The present invention also relates to receiver equipment with AC-coupled receiver circuits and AC coupling filters adapted to switch from a high coupling corner frequency, for rapid settling of a signal during preparation of data reception, to a low corner frequency, for low signal distortion during data reception.

The present invention discloses a receiver circuit that is adapted to use known properties in the signal to perform the switch at a time when the short term DC-components of the signal are as low as possible.

With reference to FIG. 5 it is shown that the a synchronization mechanism 12 is adapted to synchronize the switch 3 with the received signal, that the synchronization mechanism 12 is adapted to compensate for the relative delay between the signal at the AC coupling filters and the output of the synchronization mechanism, and that the receiver circuits are adapted to delay the switch to coincide with a point where the properties of the signal cause a low switching transient amplitude.

A receiver that is adapted to function in one embodiment according to IEEE 802.11b comprises a preamble detection mechanism 5, where a preamble of a received signal comprises a BPSK-modulated Barker sequence, and where the detection mechanism 5 is adapted to produce an unsigned scalar signal 6 which exhibits high amplitude peaks synchronized with each 1 µs symbol in the Barker sequence.

The detection mechanism 5 is adapted to perform the synchronization by locating the position of a peak over a 1 µs window if a peak value exceeds a certain threshold, thus providing a timing reference that has a fixed timing relation to the peak position.

The invention further comprises a peak search mechanism 7 that is adapted to generate an output pulse that indicates the end of a 1 µs symbol in the signal.

This may be done in various ways. The present invention teaches one embodiment where the peak search mechanism 7 is adapted to operate over repeating 1 µs windows, locate the peak position in the previous window, and generate the output pulse in the next window at the time corresponding to the last peak position.

The present invention provides another embodiment where the peak search mechanism 7 is adapted to monitor the current and previous outputs of the preamble detection mechanism 5, and where the peak search mechanism 7 is adapted to generate the output pulse at a peak position when the previous output was greater than a threshold value, and was also greater than the current output.

The result of the preamble detection/peak search is a timing reference that has a fixed alignment with the incoming signal but some arbitrary timing offset.

The present invention provides in one embodiment a delay mechanism 8 that is adapted to offset a timing reference by a constant value of up to 1 µs in relation to the output pulse in order to take into account the timing offset between the timing reference and the optimal switching instants of the AC coupling filters, as well as the delay in performing the switch.

A control unit 9 is adapted to take the decision to make the switch. The control unit 9 is adapted to request a switch by generating an AC coupling switch request signal 10, and a gate 11 is adapted to combine the switch request signal 10 with the offset timing reference such that a request to make a switch is only granted at one of the optimal switching instants.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. A method to switch from a high coupling corner frequency to a low corner frequency in a receiver, comprising:
    using properties of a received signal to perform a corner frequency switch at a time when the short term DC-components of the received signal are at a minimum;
    synchronizing the switch with the received signal, thereby causing the switch to coincide with a time instant where the properties of the received signal cause a low switching transient amplitude.

2. A method to switch from a high coupling corner frequency to a low corner frequency in a receiver, comprising using properties in a received signal to perform the corner frequency switch at a time when the short term DC-components of the signal are at a minimum, further comprising synchronizing the switch with the received signal, thereby causing the switch to coincide with a time instant, where the properties of the received signal cause a low switching transient amplitude, and wherein a preamble of a received signal comprises a BPSK-modulated Barker sequence, the method further comprising producing an unsigned scalar signal that exhibits high amplitude peaks synchronized with each symbol in the Barker sequence, and wherein synchronizing the switch comprises locating the position of a peak over a time window corresponding to a symbol in the Barker sequence, thus providing a timing reference that has a fixed timing relation to the peak position, and using the timing reference in the synchronization.

3. The method of claim 2, further comprising generating an output pulse based on the timing reference indicating the end of a symbol in the received signal.

4. The method of claim 2, wherein peaks are located over repeating time windows, and the peak position is located in a previous time window, and the output pulse is generated in a next time window at the time corresponding to the last peak position.

5. The method of claim 4, further comprising generating the output pulse when a previous peak value was greater than a threshold value, and was greater than a value of the current peak.

6. The method of claim 3, further comprising offsetting the output pulse by a constant value.

7. The method of claim 6, wherein the switch time is synchronized with the received signal by gating a switch request signal by the offset output pulse such that a request to make the switch is only granted at one of the optimal switching instants.

8. An AC-coupled receiver circuit having an AC coupling filter adapted to switch from a high coupling corner frequency to a low corner frequency, wherein the receiver circuit is configured to use a known property in a received signal to perform the switch at a time when the short term DC-components of the received signal are at a minimum;
comprising a synchronization circuit configured to synchronize the switch with the received signal, and further adapted to compensate for a relative delay between the signal at the AC coupling filter and the output of the synchronization circuit, wherein the receiver circuit is configured to delay the switch to coincide with a time instant where the properties of the received signal cause a low switching transient amplitude.

9. An AC-coupled receiver circuit having an AC coupling filter adapted to switch from a high coupling corner frequency to a low corner frequency, wherein the receiver circuit is configured to use properties in a received signal to perform the switch at a time when the short term DC-components of the signal are at a minimum, further comprising a synchronization circuit configured to synchronize the switch with the received signal, and further adapted to compensate for a relative delay between the signal at the AC coupling filters and the output of the synchronization circuit, wherein the receiver circuit is configured to delay the switch to coincide with a time instant where the properties of the signal cause a low switching transient amplitude, wherein the synchronization circuit comprises a preamble detection circuit, where a preamble of the received signal comprises a BPSK-modulated Barker sequence, and wherein the detection circuit is configured to produce an unsigned scalar signal which exhibits high amplitude peaks that are synchronized with each symbol in the Barker sequence, and wherein the detection circuit comprises a peak search circuit configured to perform the synchronization if a peak value exceeds a predetermined threshold, and wherein the detection circuit is configured to achieve the synchronization by locating the position of the peak over a time window, thus providing a timing reference that has a fixed timing relation to the peak position.

10. The receiver circuit of claim 9, wherein the peak search circuit is configured to generate an output pulse indicating an end of a symbol in the signal.

11. The receiver circuit of claim 10, wherein the peak search circuit is configured to operate over repeating time windows, locate the peak position in a previous window, and generate the output pulse in a next time window at the time corresponding to the last peak position.

12. The receiver circuit of claim 10, wherein the peak search circuit is configured to monitor a current and previous outputs of the preamble detection circuit, and wherein the peak search circuit is configured to generate the output pulse at a peak position when a previous peak was greater than a threshold value, and was greater than a current peak value.

13. The receiver circuit of claim 10, further comprising a delay circuit configured to offset the output pulse by a constant value.

14. The receiver circuit of claim 13, further comprising a control unit configured to request a switch by generating an AC coupling switch request signal, and further comprising a gate configured to gate the switch request signal with the offset output pulse.

* * * * *